United States Patent
Li

(10) Patent No.: US 9,893,182 B2
(45) Date of Patent: Feb. 13, 2018

(54) FINFET AND METHOD FOR FORMING THE SAME

(71) Applicant: Semiconductor Manufacturing International (Shanghai) Corporation, Shanghai (CN)

(72) Inventor: Yong Li, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 43 days.

(21) Appl. No.: 14/989,215

(22) Filed: Jan. 6, 2016

(65) Prior Publication Data

US 2016/0197182 A1 Jul. 7, 2016

(30) Foreign Application Priority Data

Jan. 6, 2015 (CN) .......................... 2015 1 0006054

(51) Int. Cl.
*H01L 29/78* (2006.01)
*H01L 29/66* (2006.01)
*H01L 21/02* (2006.01)

(52) U.S. Cl.
CPC .... *H01L 29/7833* (2013.01); *H01L 21/02142* (2013.01); *H01L 29/6656* (2013.01); *H01L 29/66795* (2013.01); *H01L 29/785* (2013.01)

(58) Field of Classification Search
CPC .... H01L 29/785–2029/7858; H01L 29/66803; H01L 29/66795; H01L 2924/13067; H01L 29/7831; H01L 29/7833
See application file for complete search history.

(56) References Cited

U.S. PATENT DOCUMENTS

| 8,362,575 B2* | 1/2013 | Kwok | H01L 29/045 257/368 |
| 9,147,682 B2* | 9/2015 | Ching | H01L 21/823821 |
| 2014/0273365 A1* | 9/2014 | Wei | H01L 21/823821 438/199 |

* cited by examiner

*Primary Examiner* — Jose R Diaz
(74) *Attorney, Agent, or Firm* — Anova Law Group, PLLC

(57) ABSTRACT

The present disclosure provides a method for forming a field-effect fin transistor (FinFET) structure. The method includes providing a substrate with fin structures; forming a gate structures across the fin structures; and forming ion implantation regions in the fin structures at both sides of the gate structure. The method also includes removing top portions of the fin structures at both sides of the gate structure to form remaining portions of the fin structures; forming a first semiconductor material layer on the remaining portions of the fin structures; and forming a second semiconductor material layer on the first semiconductor material layer, the second semiconductor material being doped with barrier-lowering ions. The method further includes forming a metal layer on the second semiconductor material layer, and performing an annealing process on the metal layer to form a contact-resistance-reducing layer.

20 Claims, 8 Drawing Sheets

FINFET AND METHOD FOR FORMING THE SAME

CROSS-REFERENCES TO RELATED APPLICATIONS

This application claims the priority of Chinese Patent Application No. 201510006054.3, filed on Jan. 6, 2015, the entire content of which is incorporated herein by reference.

FIELD OF THE DISCLOSURE

The present disclosure relates to the field of semiconductor technology, more particularly, relates to a FinFET and a method for forming the FinFET.

BACKGROUND

As semiconductor technology advances to narrower or smaller technology nodes, transistors used in semiconductor technology are gradually undergoing transition from planar complementary metal-oxide semiconductor (CMOS) transistors to three dimensional field-effect fin transistors (FinFETs). In a FinFET, the channel may be controlled from both sides of the gate structure. An improved ability to control the channel can thus be implemented in a FinFET compared to a MOSFET or CMOS transistor. A FinFET can suppress short channel effect fairly well. Compared to other related devices, FinFETs have better compatibility with current integrated circuit (IC) fabrication processes.

A fabrication process to form an existing N-type FinFET is shown in FIGS. 1-4. First, as shown in FIGS. 1-2, a semiconductor substrate 10 is provided. The semiconductor substrate 10 includes fin structures 11.

Specifically, the semiconductor substrate 10 includes a silicon substrate 101 with at least two separated protrusion structures and an insulating layer 102 between the protrusion structures. The insulating layer 102 is positioned to be lower than the protrusion structures. The protrusion structures, positioned to be higher than the insulating layer 102, are the fin structures 11.

Further, a gate structure 12 across the fin structures 11 is formed. The gate structure includes a gate oxide layer 121 and a gate electrode layer 122 on the gate oxide layer 121.

Further, a first spacer material layer 13' is formed on the semiconductor substrate 10, the top and the sidewalls of the fin structures 11, and the top and the sidewalls of the gate structure 12. The first spacer material layer 13' includes a silicon dioxide layer (not shown) and a silicon nitride layer (not shown) on the silicon dioxide layer.

Further, referring to FIG. 2, a lightly doped drain (LDD) ion implantation and a Halo ion implantation are performed on the fin structures 11 on both sides of the gate structure 12. A thermal annealing process is further performed to form an LDD ion implantation region and a Halo ion implantation region in the fin structures 11 on both sides of the gate structure 12.

Further, referring to FIG. 3, after the LDD ion implantation regions and the Halo ion implantation regions are formed, a second spacer material layer (now shown) is formed on the first spacer material layer 13'. The second spacer material layer is made of silicon nitride.

Further, a recess etching process is performed on the first spacer material layer 13' and the second spacer material layer to form gate spacers (not shown) surrounding the gate structure 12 and fin spacers surrounding fin structures 11.

A fin spacer includes a silicon dioxide spacer 13a and a silicon nitride spacer 14a on the silicon dioxide spacer 13a. The silicon nitride spacer 14 is formed from the silicon nitride layer in the first spacer material layer 13' and the silicon nitride layer in the second spacer material layer.

Further, referring to FIG. 3, an in-situ doping growth process is performed to form a silicon carbide layer 15 on the fin structures 11. The silicon carbide layer 15 is doped with the ions for forming the source and the drain of the FinFET. The doped silicon carbide layer 15 forms the source and the drain of the N-type FinFET. The ions, for forming the source and the drain, are phosphorus ions.

Further, as shown in FIG. 4, an epitaxial deposition is used to grow a silicon cap (Si-Cap) layer 16 on the silicon carbide layer 15. Further, a metal layer is formed on the Si-Cap layer and an annealing process is performed on the metal layer. The metal layer and the Si-Cap layer are melted to form a metal silicide layer (not shown).

Thus, an N-type FinFET can be formed. However, the performance of the N-type FinFETs formed by such existing fabrication process may still need to be improved. The disclosed device structures and methods are directed to solve one or more problems set forth above and other problems.

BRIEF SUMMARY OF THE DISCLOSURE

One aspect of the present disclosure provides a method for forming a field-effect fin transistor (FinFET) structure. The method includes providing a substrate with fin structures; forming a gate structures across the fin structures; forming ion implantation regions in the fin structures at both sides of the gate structure; and removing top portions of the fin structures at both sides of the gate structure to form remaining portions of the fin structures. The method also includes forming a first semiconductor material layer on the remaining portions of the fin structures, the first semiconductor material layer being doped with ions for forming a source and a drain of the FinFET structure; forming a second semiconductor material layer on the first semiconductor material layer, the second semiconductor material being doped with barrier-lowering ions; and forming a metal layer on the second semiconductor material layer. The method further includes performing an annealing process on the metal layer to form a contact-resistance-reducing layer.

Another aspect of the present disclosure provides an N-type field effect fin transistor (FinFET) structure. The FinFET structure includes a substrate with fin structures; a gate structure positioned across the fin structures; ion implantation regions in the fin structures on both sides of the gate structure; and a source and a drain formed on the fin structures. The FinFET structure also includes a contact-resistance-reducing layer formed on the source and the drain of the FinFET structure. Top portions of the fin structures on both sides of the gate structure are removed to form remaining portions of the fin structures; a first semiconductor material layer is formed on the remaining portions of the fin structures, the first semiconductor material layer being doped with ions for forming a source and a drain of the FinFET; and the contact-resistance-reducing layer is formed on the first semiconductor material layer.

Other aspects or embodiments of the present disclosure can be understood by those skilled in the art in light of the description, the claims, and the drawings of the present disclosure

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

According to the present disclosure, the performance of the N-type FinFET formed by the existing semiconductor technology still needs to be improved. The reasons for the inferior performance may be described as follows.

Figure 1:
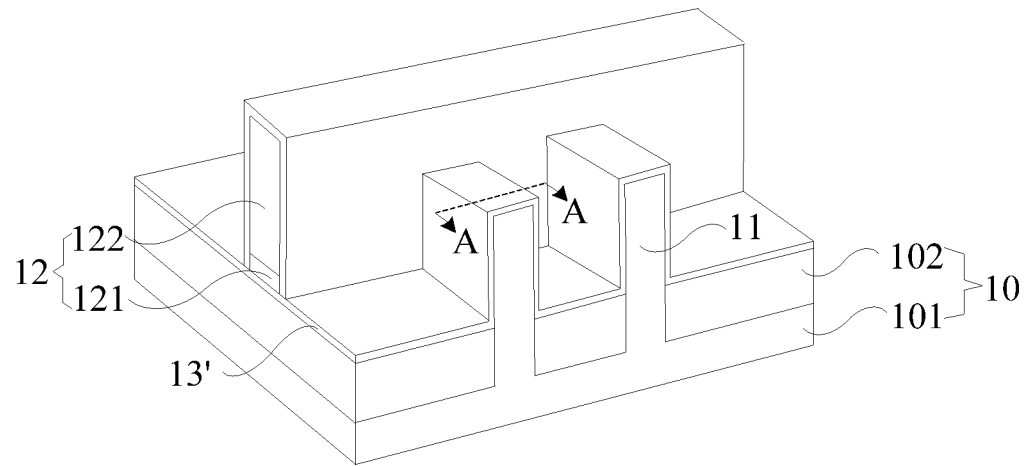
FIG. 1 illustrates a three-dimensional structure of a semiconductor substrate and certain structures formed on the semiconductor substrate in existing semiconductor technology.
Figure 2:
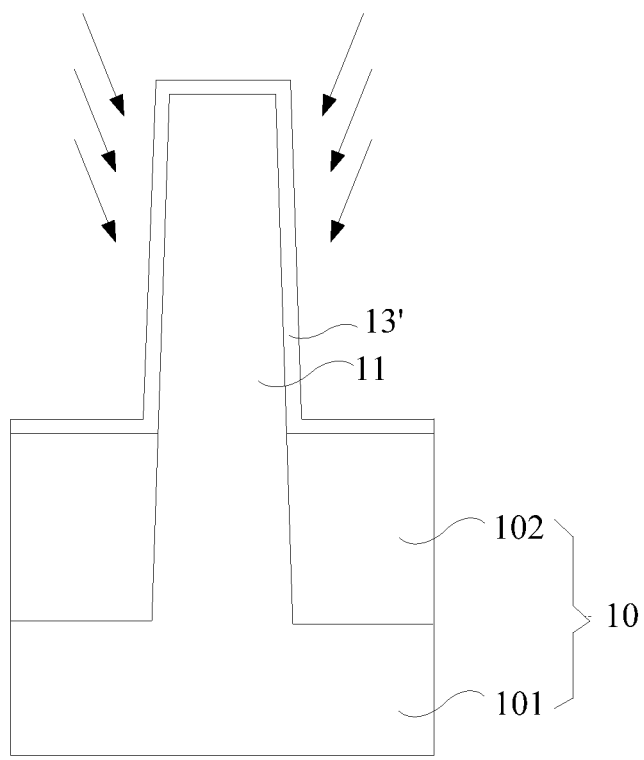
FIG. 2 illustrates a cross-sectional view of a fin structure shown in FIG. 1 along the AA direction.
Figure 3:
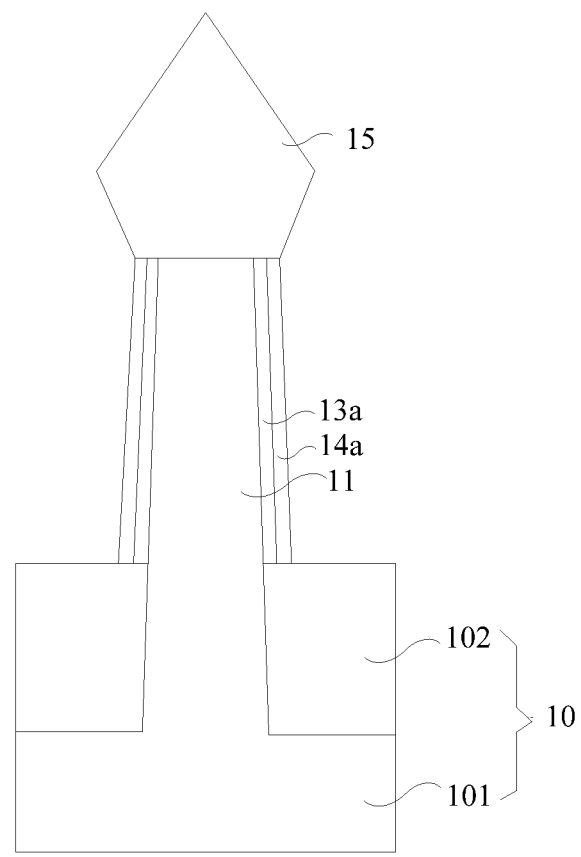
FIGS. 3-4 are each a cross-sectional view of a fin structure in the N-type FinFET formed by the existing semiconductor technology after the structure shown in FIG. 2 is formed.
Figure 4:
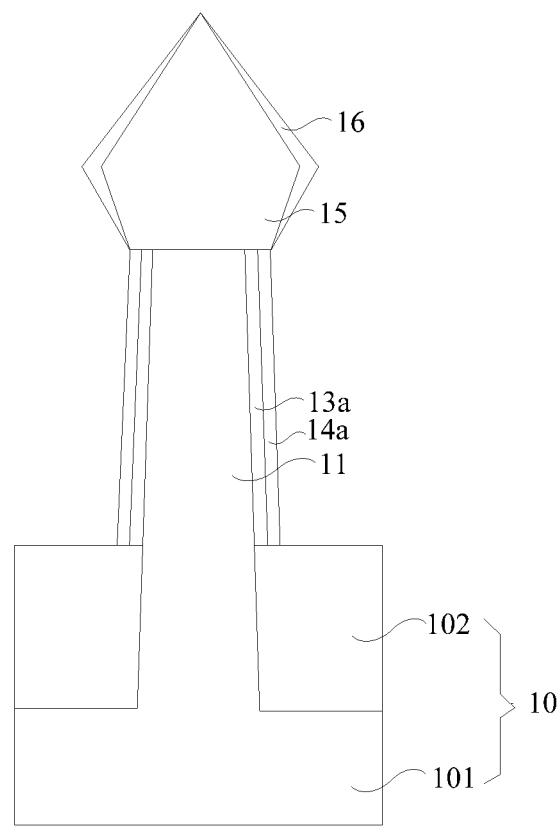

Referring to FIG. 2, during the LDD and Halo ion implantations on the fin structures 11 on both sides of the gate structure 12, the top portions of the fin structures 11 may undergo serious lattice damage. Also, the subsequent annealing process may be unable to repair the lattice damage of the fin structure 11.

For a planar transistor, the LDD and Halo ion implantations often cause damages to the surface of the substrate. However, the damages on the surface of the substrate can be repaired in time through a subsequent annealing process. Because the substrate contains a sufficient amount of single-crystal silicon, the single-crystal silicon can spread into the damaged portions of the substrate during the annealing process to repair the damages on the surface of the substrate.

For a FinFET, the size of a fin structure 11 is often very small. After the fin structure 11 is damaged in the LDD and Halo ion implantations, even if an annealing process is performed, it is difficult for the single-crystal silicon in the silicon substrate 101 to spread from the bottom of the fin structure 11 to the top portion of the fin structure 11 to repair the top portion of the fin 11. Thus, it is difficult to use the single-crystal silicon in the silicon substrate 101 to repair the top portion of the fin structure 11. As a result, twin defects are often formed in the top portion of a fin structure 11. The twin defects can subsequently adversely affect the performance of the FinFET.

In the existing semiconductor technology, the wafer is often heated up to about 300° C. to about 500° C. during the LDD and Halo ion implantations. Damages to the fin structures can thus be reduced. However, the high temperature often ashes the photoresist layer on the wafer, which more severely affects the performance of the subsequently-formed N-type FinFET.

To solve the problems described above, the present disclosure provides a method for forming an N-type FinFET. By using the disclosed method, the performance of the formed N-type FinFET can be improved. FIG. 12 illustrates an exemplary fabrication process for forming the N-type FinFET and FIGS. 5-11 illustrate an exemplary fin structure in the N-type FinFET corresponding to various stages of the fabrication process.

Figure 5:
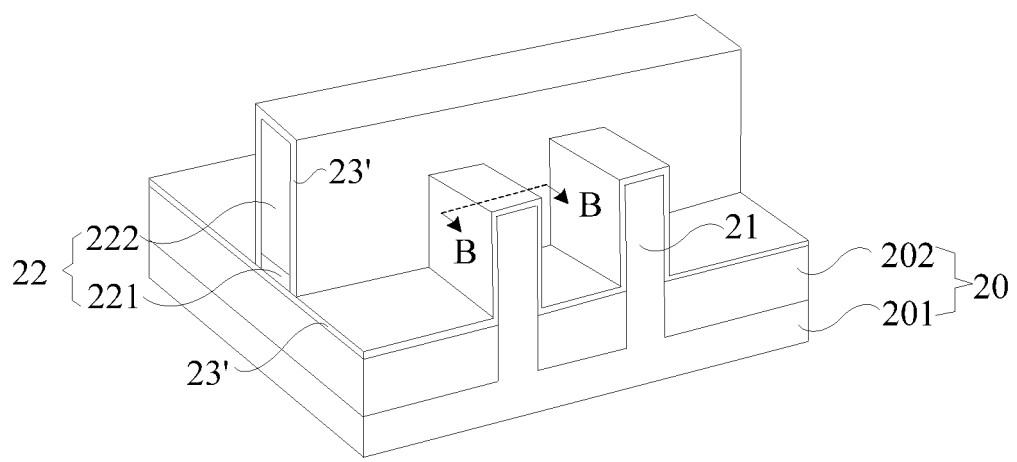
FIG. 5 illustrates a semiconductor substrate and certain structures formed on the semiconductor substrate consistent with the embodiments of the present disclosure.
Figure 6:
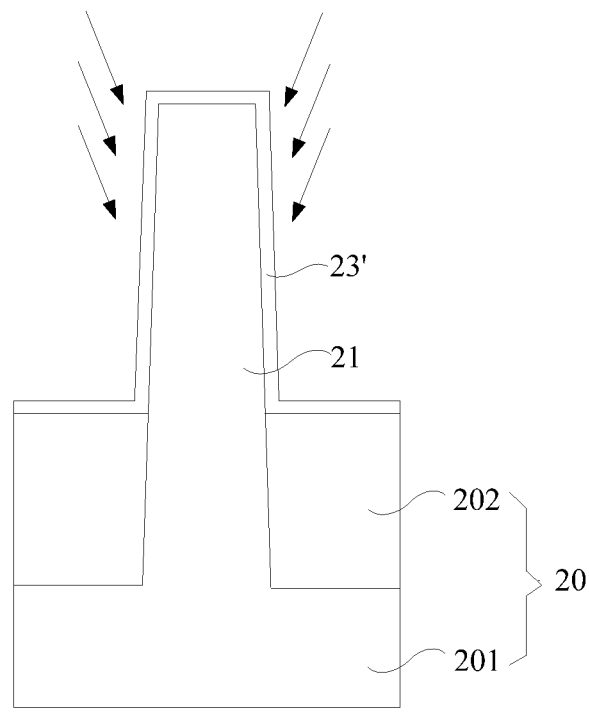
FIG. 6 illustrates a cross-sectional view of a fin structure shown in FIG. 5 along the BB direction.

As shown in FIG. 12, at the beginning of the fabrication process, a substrate is provided, and the substrate includes fin structures (S101). FIGS. 5-6 illustrate a corresponding FinFET structure.

As shown in FIGS. 5-6, a substrate 20 is provided. The substrate 20 may be made of a suitable material such as a semiconductor material. The substrate 20 may include fin structures 21.

In one embodiment, the substrate 20 may include a silicon substrate 201 and an insulating layer 202. The silicon substrate 201 may include at least two separate protrusion structures. The insulating layer 202 may be positioned at least between the two protrusion structures. The insulating layer 202 may be positioned to be lower than the protrusion structures. The protrusion structures, higher than the insulating layer 202, may be the fin structures 21. The insulating layer 202 may be made of silicon dioxide.

In some other embodiments, the substrate 20 may also be a silicon on insulator (SOI) substrate. The silicon, on the insulator, may include a bottom silicon layer, an insulating layer on the bottom silicon layer, and a top silicon layer on the insulating layer. The top silicon layer may be etched to form fin structures.

Referring to FIG. 12, after a substrate is provided, a gate structure is formed, and the gate structure is positioned across the fin structures (S102). FIGS. 5-6 illustrate a corresponding FinFET structure.

As shown in FIGS. 5-6, a gate structure 22 may be formed. The gate structure 22 may be positioned across the fin structures 21. In one embodiment, the gate structure 22 may include a gate dielectric layer 221 and a gate electrode layer 222 on the gate dielectric layer 221. When the gate dielectric layer 221 is made of silicon dioxide, the gate electrode layer 222 may be made of poly-silicon. When the gate dielectric layer 221 is made of a high-k dielectric material, the gate electrode layer 222 may be made of metal. The high-k material may be made of one or more of $HfO_2$, $Al_2O_3$, $ZrO_2$, HfSiO, HfSiON, HMO, and HfZrO.

Referring to FIG. 12, after a gate structure is formed, a first spacer material layer is formed. The first spacer material layer is formed on the substrate, the top surfaces and the sidewalls of the fin structures, and the top surface and the sidewalls of the gate structure. An LDD ion implantation region and a Halo ion implantation region are formed in the fin structures (S103). FIGS. 5-6 illustrate a corresponding FinFET structure.

As shown in FIGS. 5-6, a first spacer material layer 23' may be formed. The first spacer material layer 23' may be formed on the substrate 20, the top surfaces and the sidewalls of the fin structures 21, and the top surface and the sidewalls of the gate structure 22. The first spacer material layer 23' may include a silicon dioxide layer positioned at the bottom of the first spacer material layer 23' (not shown) and a silicon nitride layer (not shown) positioned on the silicon dioxide layer.

Further, an LDD ion implantation and a Halo ion implantation may be performed on the fin structures 21 on both sides of the gate structure 22. An annealing process may be performed to form an LDD ion implantation region and a Halo ion implantation region in the fin structures 21 on both sides of the gate structure 22. The ion implantation operations on the fin structures 21 described above are illustrated by the arrows in FIG. 6.

At this time, after the annealing process, the crystal lattice in the top portions of the fin structures 21 may undergo lattice damages. Twin defects may be formed in the top portions of the fin structures 21.

Figure 7:
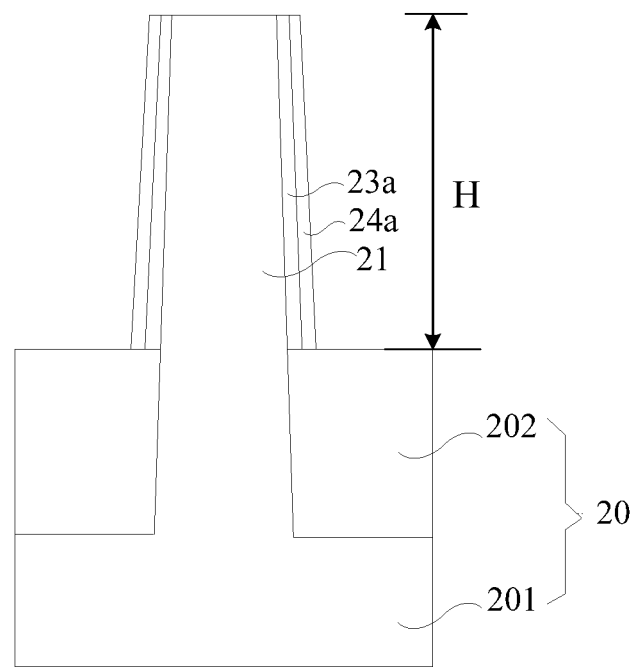
FIGS. 7-11 illustrate cross-sectional views of a fin structure in an exemplary N-type FinFET corresponding to certain stages of an exemplary fabrication process consistent with the disclosed embodiments.

Referring to FIG. 12, after the LDD ion implantation region and the Halo ion implantation region are formed, a second spacer material layer is formed on the first spacer material layer. Gate spacers and fin spacers are formed from the first spacer material layer and the second spacer material layer (S104). FIG. 7 illustrates a corresponding FinFET structure.

As shown in FIG. 7, after the LDD ion implantation region and the Halo ion implantation region are formed, a second spacer material layer (not shown) may be formed on the first spacer material layer 23'. The second spacer material layer may be made of silicon nitride.

Further, a recess etching process may be performed on the first spacer material layer 23' and the second spacer material layer to form gate spacers surrounding the gate structure 22 and fin spacers surrounding the fin structures 21.

A fin spacer may include a silicon dioxide spacer 23a and a silicon nitride spacer 24a formed on the silicon dioxide spacer 23a. The silicon nitride spacer 24a may be formed by the silicon nitride layer in the first spacer material layer 23' and the silicon nitride layer in the second spacer material layer.

The silicon dioxide spacer 23a may be a strain-buffering layer for the corresponding silicon nitride spacer 24a. Without the silicon dioxide spacer 23a, the silicon nitride spacer 24a may apply an undesirably high strain on the corresponding fin structure 21. Further, because the fin structures 21 may be small, the high strain may cause dislocations in the silicon lattice in the fin structures 21. As a result, the subsequently-formed N-type FinFET may have impaired performance.

Figure 8:
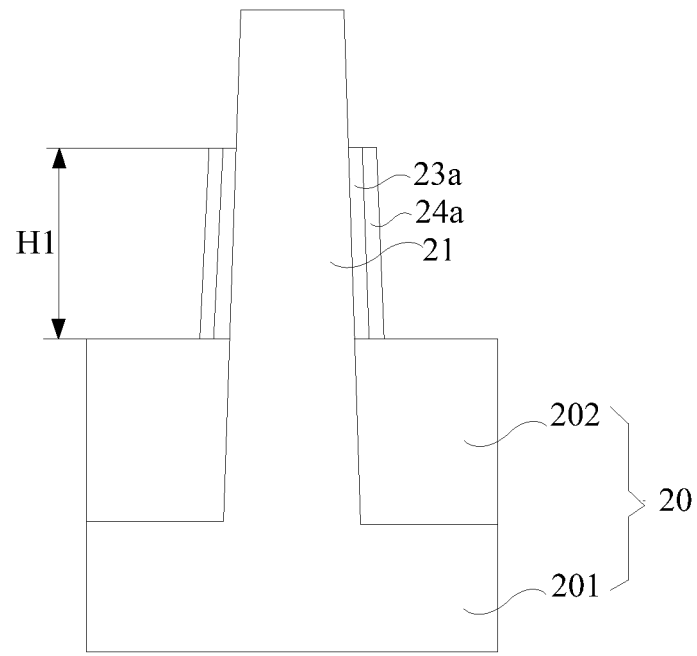
Figure 9:
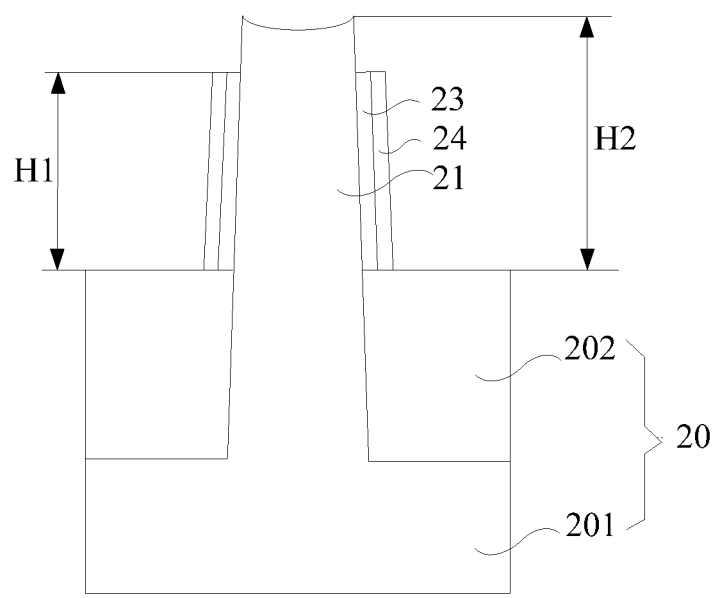

Referring to FIG. 12, after the gate spacers and the fin spacers are formed, the top portions of the fin structures on both sides of the gate structure are removed (S105). FIGS. 8 and 9 illustrate a corresponding FinFET structure.

As shown in FIGS. 8-9, the top portions of the fin structures 21, on both sides of the gate structures 22, may be removed.

In one embodiment, a top portion of the silicon nitride spacer 24a on a fin spacer may first be removed. The top portion refers to an upper portion of the silicon nitride spacer 24a, e.g., from the top of the silicon nitride spacer 24a to a desired position that is between the top and the bottom of the silicon nitride spacer 24a. The remaining silicon nitride spacer 24 may have a height of H1, as shown in FIG. 9.

In one embodiment, the process to remove the top portion of the silicon nitride spacer 24a may include a dry etching process. The etchant gas may include $CHF_3$ gas, which may include a diluting gas of Ar gas. The operating condition of the dry etching process may include $CHF_3$ gas with a flow rate of about 1 sccm to about 200 sccm; Ar gas with a flow rate of about 10 sccm to about 500 sccm; an etching pressure of about 10 mTorr to about 200 mTorr; a frequency of a radio frequency (RF) energy source from about 0.1 Hz to about 1000 Hz; a power of the RF energy source of about 50 W to about 500 W; a biasing power of about 0 W to about 200 W; and a duty cycle of about 10% to about 90%.

After the remaining silicon nitride spacer 24, with a height of H1, is formed, the silicon dioxide spacer 23a on the fin spacer may be exposed. A top portion of the silicon dioxide spacer 23a on the fin spacer may be removed. The top portion refers to an upper portion of the silicon dioxide spacer 23a, e.g., from the top of the silicon dioxide spacer 23a to a desired position that is between the top and the bottom of the silicon dioxide spacer 23a. The remaining silicon dioxide spacer 23 may also have a height of H1, as shown in FIG. 9.

In one embodiment, the process to remove the top portion of the silicon dioxide spacer 23a may include a dry etching process. The etchant gas may include $C_4F_8$, which may include a diluting gas of Ar gas. The operating condition of the dry etching process may include $C_4F_8$ with a flow rate of about 5 sccm to about 200 sccm; Ar gas with a flow rate of about 10 sccm to about 500 sccm; an etching pressure of about 10 mTorr to about 200 mTorr; a frequency of a RF energy source of about 0.1 Hz to about 1000 Hz; a power of the RF energy source of about 50 W to about 500 W; a biasing power of about 0 W to about 200 W; and a duty cycle of about 10% to about 90%.

By using the conditions and operation described above, the height of the fin spacer may be reduced to H1, and the portion of fin structure 21 corresponding to the removed top portion of the fin spacer may be exposed. The top surface of the exposed top portion of the fin structure 21 may have an inward shape, as shown in FIG. 9. The top surface of the exposed portion of the fin structure 21 may have a regular arc shape with desired smoothness. For example, the top surface of the exposed top portion of the fin structure 21 may be a regular bowl-shape pit. The bowl-shape pit may have smooth inner sidewalls, i.e., the inner sidewalls for contacting the subsequently-formed first semiconductor material layer. The operating conditions of the dry etching process need to be precisely controlled. Any deviation of the operating conditions may adversely affect the smoothness and the shape of the top surface of the exposed top portion of the fin structure 21.

Further, the exposed top portion of the fin structure 21 may be removed through a dry etching process. The remaining portion of the fin structure 21 may have a height of about H2. The initial height of the fin structure 21, before the top portion of the silicon nitride spacer 24a is removed, may be about H, as shown in FIG. 7. In one embodiment, the removed top portion of the fin structure 21 may be less than 10 nm. The specific amount or portion of the fin structure 21 to be removed may be determined according to different sizes of the fin structures 21 and should not be limited by the embodiments of the present disclosure.

In one embodiment, the top surface of the remaining portion of the fin structure 21 may also have an inward shape, as shown in FIG. 9. The top surface of the remaining portion of the fin structure 21 may have a regular arc shape with desired smoothness.

In subsequent fabrication steps, a first semiconductor material layer may be formed on the top surface of the remaining portion of the fin structure 21. The top surface of the remaining portion of the fin structure 21 may have a desired smoothness, so that the first semiconductor material layer may have a regular shape. The first semiconductor material layer, with a regular shape, may be more suitable for applying a tensile strain on the subsequently-formed N-type FinFET. The tensile strain may improve the carrier mobility of the N-type FinFET. Thus, the performance of the N-type FinFET may be further improved.

In addition, because the first semiconductor material layer, formed on the top surface of the remaining portion of the fin structure 21, may have a regular shape with desired smoothness, the first semiconductor material layers formed on adjacent fin structures 21 may not grow to connect or merge with each other and cause short circuits between metal plugs of sources and/or between metal plugs of drains that are formed in subsequent fabrication steps.

In one embodiment, removing the top portion or the damaged top portion of a fin structure 21 may reduce or eliminate twin defects in the fin structure 21. The performance of the subsequently-formed N-type FinFET may be improved.

In some embodiments, a pre-cleaning process may be performed after the top surface of the remaining portion of the fin structure 21 is exposed and before a first semiconductor material layer is formed on the remaining portion of the fin 21.

Further, the height of the remaining portion of a fin structure 21, H2, may be greater than or equal to $\frac{2}{3}H$ and less than or equal to $\frac{5}{6}H$. That is, the height of the removed top portion of the fin structure 21 may be greater than or equal to about $\frac{1}{6}H$ and less than or equal to about $\frac{1}{3}H$. If the height of the removed top portion of the fin structure 21 is overly large, the size of the subsequently-formed channel may be affected. The performance of the subsequently-formed N-type FinFET may be adversely affected. If the height of the removed top portion of the fin structure 21 is overly small, twin defects formed in the top portions of the fin structures 21 may not be completely removed. The performance of the subsequently-formed N-type FinFET may also be adversely affected.

It should be noted that, in one embodiment, the height of the remaining fin spacer may be less than the height of the remaining portion of the fin structure 21. The reasons for such a height arrangement may be explained as follows. In subsequent fabrication steps, the first semiconductor material layer may be grown using in-situ doping growth and/or epitaxial deposition on the remaining portion of the fin structure 21. Because the subsequently-formed FinFET structure is N-type, the first semiconductor material layer may be made of silicon carbide. The growth of silicon carbide on the remaining portion of the fin structure 21 is often very slow. Because the height of a remaining fin spacer is less than the height of the corresponding remaining portion of the fin structure 21, the top portion of the remaining portion of the fin structure 21 may be fully exposed. Thus, the growth rate of the first semiconductor material layer on a remaining portion of the fin structure 21 may be improved, and the volume of the first semiconductor material layer may be increased. The performance of the subsequently-formed N-type FinFET may be improved. In some embodiments, the first semiconductor material layer 25 may be made of silicon and/or silicon carbide.

Further, in one embodiment, the height of the remaining fin spacer, H1, may be larger than about $\frac{1}{3}H$ and less than about $\frac{2}{3}H$. The reasons for reducing the fin spacer to a predetermined height H1 may be explained as follows. If the height of the remaining fin spacer is overly small, i.e., the height of the removed top portion of the fin spacer is overly large, the volume of the first semiconductor material layer, subsequently-formed on the remaining portion of the fin structure 21, may be overly large. The first semiconductor material layers on adjacent fin structures 21 may be grown to connect and form short circuits in the subsequently-formed FinFET structure. If the height of the remaining fin spacer is overly large, i.e., the height of the removed top portion of the fin spacer is overly small, the first semiconductor material layers grown on adjacent fin structures 21 may have an undesirably low growth rate. The performance of the subsequently-formed N-type FinFET may be adversely affected. Further, using the disclosed height of the remaining fin spacer, the first semiconductor material layer grown on the remaining portion of the fin structures 21 may apply a desired tensile strain on the corresponding channel region. The growth time of the first semiconductor material layer may be the shortest or may be optimized.

In certain other embodiments, the height of the remaining fin spacer may be greater than or equal to the height of the remaining portion of the fin structure 21. The specific heights of the fin spacer and the remaining portion of the fin structure 21 should not be limited by the embodiments of the present disclosure.

Figure 10:
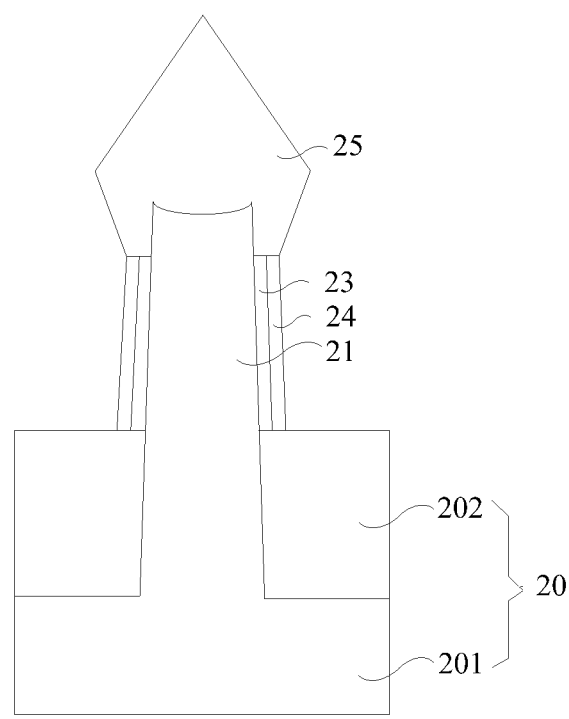

Referring to FIG. 12, after the top portions of the fin structure are removed, the first semiconductor material layer is formed on the surface of the remaining portions of the fins. The first semiconductor material is doped with ions for forming the source and the drain of the FinFET structure. The source and the drain of the N-type FinFET are further formed (S106). FIG. 10 illustrates a corresponding FinFET structure.

As shown in FIG. 10, the first semiconductor material layer 25 may be formed on the surface of the remaining portions of the fins. The first semiconductor material 25 may be doped with ions for forming the source and the drain of the subsequently-formed N-type FinFET.

In one embodiment, the first semiconductor material layer 25 may be made of silicon carbide. The ions for forming the source and the drain, doped in the first semiconductor material layer 25, may be phosphorus ions.

In one embodiment, the process to form the first semiconductor material layer 25, doped with the ions for forming the source and the drain, may include an in-situ doping growth. The reasons for using an in-situ doping growth to form the first semiconductor material layer 25 may include that, the in-situ doping growth may be easier to control than ion implantation. Gradient doping of ions may be implemented in the formation of the first semiconductor material layer 25.

After using in-situ doping growth to form the first semiconductor material layer 25, ion implantation may be performed on the first semiconductor material layer 25. Further, an annealing process may be performed on the first semiconductor material layer 25 to form the source and the drain.

In certain other embodiments, an epitaxial deposition may also be used to form the first semiconductor material layer 25 on the exposed top portion or surface of the remaining portion of the fin structure 21. Further, an ion implantation may be performed on the first semiconductor material layer 25. Further, an annealing process may be performed on the first semiconductor material layer 25 to form the source and the drain. The specific types of process to form the first semiconductor material layer 25 should not be limited by the embodiments of the present disclosure.

After the first semiconductor material layer 25 is formed, the first semiconductor material layer 25 may apply a tensile strain on the subsequently-formed N-type FinFET to improve the performance of the N-type FinFET.

Figure 11:
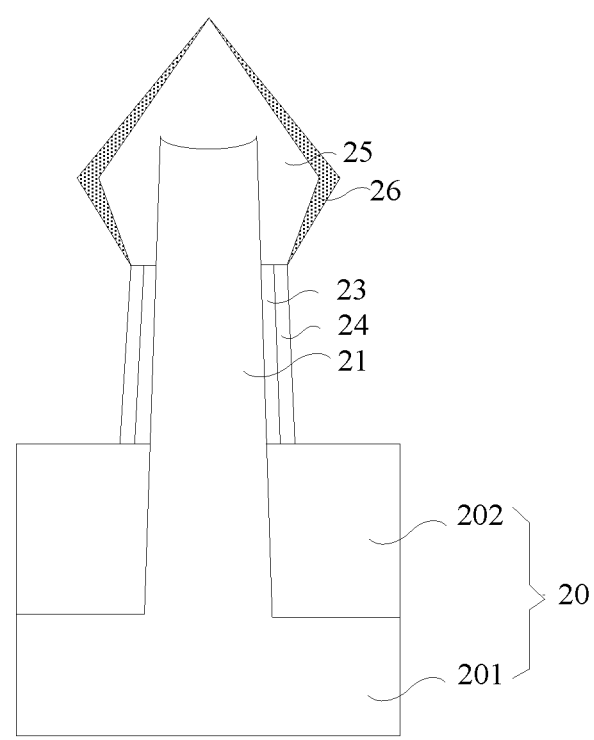
Figure 12:
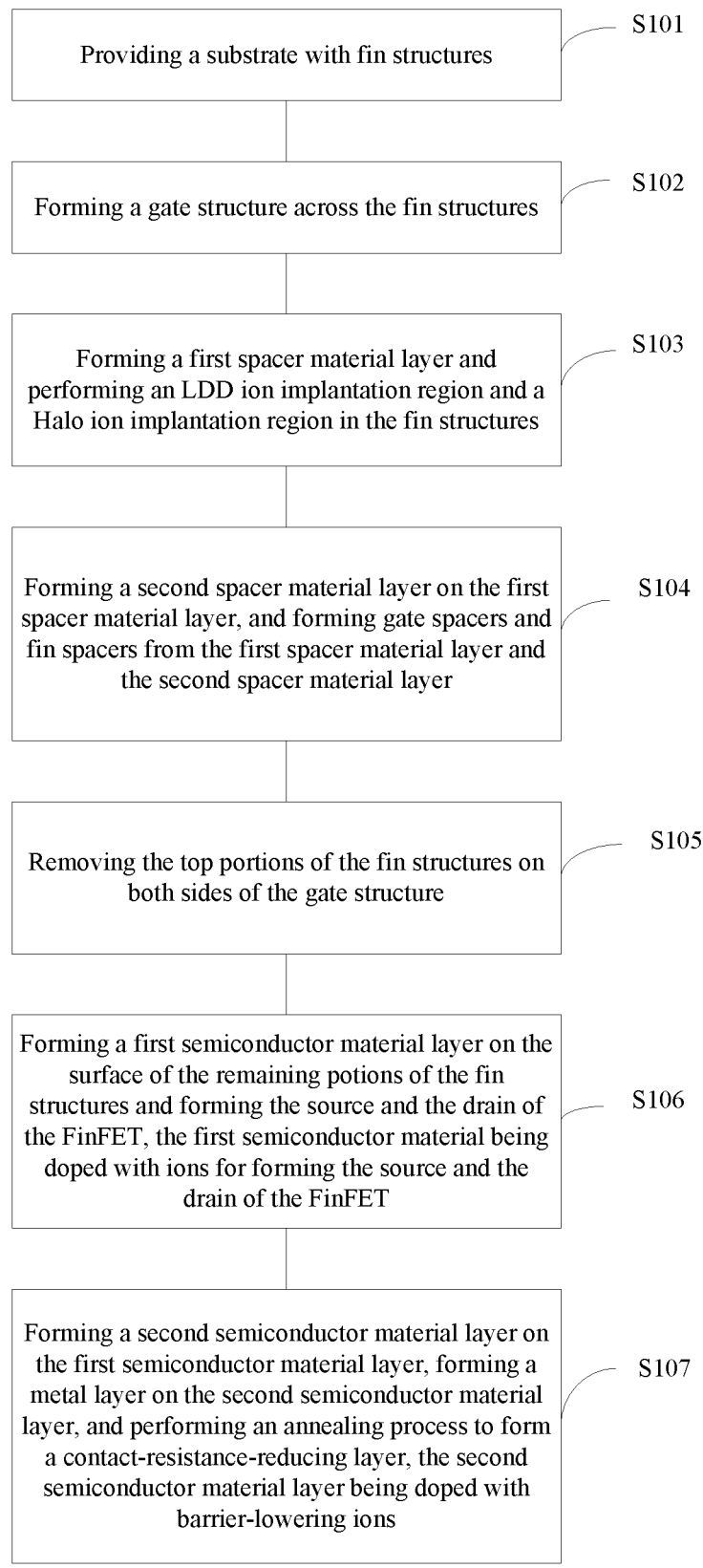
FIG. 12 illustrates an exemplary fabrication process of an N-type FinFET consistent with various disclosed embodiments.

Referring to FIG. 11, after the source and the drain are formed, a second semiconductor material layer is formed on the first semiconductor material layer. The second semiconductor material layer is doped with barrier-lowing ions. A metal layer is formed on the second semiconductor material layer and undergoes an annealing process to form a contact-resistance-reducing layer (S107). FIG. 11 illustrates a corresponding FinFET structure.

As shown in FIG. 11, after the source and the drain are formed, a second semiconductor material layer 26 may be formed on the first semiconductor material layer 25. The second semiconductor material layer 26 may be doped with barrier-lowing ions. A metal layer (not shown) may be formed on the second semiconductor material layer 26 and may undergo an annealing process to form a contact-resistance-reducing layer.

In one embodiment, the second semiconductor material layer 26 may be made of silicon. The barrier-lowering ions may include one or more types of sulfur ions, selenium ions, arsenic ions, antimony ions, and germanium ions. In certain other embodiments, the second semiconductor material layer 26 may also be made of silicon carbide. The specific material that the second semiconductor material layer 26 is made of should not be limited by the embodiments of the present disclosure.

In one embodiment, the process for forming the second semiconductor material layer 26 with barrier-lowering ions may include an in-situ doping growth. During the process to grow the silicon, i.e., the material for forming the second semiconductor material layer 26, in-situ doping may be performed to mix doping gases with gases to form silicon. The doping gases may include one or more types of sulfur ions, selenium ions, arsenic ions, antimony ions, and germanium ions.

The reasons for using in-situ doping growth to form the second semiconductor material layer 26 with barrier-lowering ions may include that, in-situ doping growth may be easier to control compared to ion implantation. Gradient doping of ions may be implemented in the second semiconductor material layer 26. On the other hand, the in-situ doping growth may avoid damages to the lattice of the second semiconductor material 26 when the barrier-lowering ions are implanted or injected into the second semiconductor material layer 26.

In one embodiment, when in-situ doping growth is used to form the second semiconductor material layer 26 with the barrier-lowering ions, phosphorus ions may be doped into the second semiconductor material layer 26 simultaneously. Further, the doping concentration of phosphorus ions may be higher than the doping concentration of the barrier-lowering ions. The reasons for the doping concentration arrangement may be explained as follows. The doping of phosphorus ions may enable the phosphorus ions to be located on the non-substitution points of the crystal lattice of the second semiconductor material layer 26. In the annealing process to reduce the contact resistance of the second semiconductor material layer 26, the doped phosphorus ions may be activated and may occupy the crystal lattice of the second semiconductor material layer 26. Because the contact resistance of the second semiconductor material layer 26 is inversely proportional to the doping concentration of the phosphorus ions, the doping of the phosphorus ions and/or the increasing of the concentration of phosphorus ions in the second semiconductor material layer 26 may reduce the contact resistance of the second semiconductor material layer 26. The concentration of phosphorus ions may be referred as $N_D$ or n-type doping concentration.

In some other embodiments, when in-situ doping growth is used to form the second semiconductor material layer 26 with the barrier-lowering ions, phosphorus ions may not be doped into the second semiconductor material layer 26 simultaneously. The reasons for not doping phosphorus ions simultaneously with the in-situ doping growth may be that, in subsequent annealing process, the phosphorus ions in the first semiconductor material layer 25 may diffuse to the second semiconductor material layer 26. The doping of phosphorus ions into the second semiconductor material layer 26 should not be limited by the embodiments of the present disclosure.

In certain other embodiments, epitaxial deposition may be used to form the second semiconductor material layer 26 on the exposed top portion or surface of the remaining portion of the fin structure 21. Further, barrier-lowering ions may be injected or implanted into the second semiconductor material layer 26.

Further, a metal layer (not shown) may be formed on the second semiconductor material layer 26.

In one embodiment, the metal layer may be made of nickel. The metal layer may be formed by chemical vapor deposition and/or physical sputtering. In one embodiment, the reasons for using nickel as the metal layer may include, the nickel silicide particles formed during the subsequent annealing process may have sufficiently small sizes with desirably low resistance. The low-resistance phase of the nickel silicide may undergo full nucleation and growth. In addition, because the nickel silicide particles have small sizes, electrical contact between the nickel silicide and other components are easy to be formed.

In some other embodiments, the metal layer may also be made of cobalt, molybdenum, platinum, tantalum, titanium, tungsten, and/or other suitable metal with high melting points. The specific type of metal should not be limited by the embodiments of the present disclosure.

Further, an annealing process may be performed on the metal layer to form a contact-resistance-reducing layer (not shown).

In one embodiment, the contact-resistance-reducing layer may be made of metal silicide. Particularly, when the metal is made of nickel, the metal silicide is made of $NiSi_2$. The annealing process may be a rapid thermal annealing (RTA) process. The annealing temperature of the RTA process may be higher than or equal to 150° C. and lower than or equal to 900° C.

The process to form the contact-resistance-reducing layer may be described as follows. The metal layer may react with the second semiconductor material layer 26. Specifically, the metal layer and the second semiconductor material layer 26 may be melted to form a metal silicide layer, i.e., a contact-resistance-reducing layer. The contact-resistance-reducing layer may reduce the contact resistance between the source and the corresponding metal plug formed on the source, and between the drain and the corresponding metal plug formed on the drain.

In one embodiment, the thickness of the second semiconductor material layer 26 may be greater than the thickness of the contact-resistance-reducing layer. Because the second semiconductor material layer 26 is doped with phosphorus ions, the doped phosphorus may reduce the resistance of the second semiconductor material layer 26. The contact resistance between the metal plug and the corresponding source/drain may not be affected. In one embodiment, the reasons for forming the second semiconductor material layer 26 with the barrier-lowering ions may be described as follows.

In the annealing process to form the contact-resistance-reducing layer, the solid solubility of the barrier-lowering ions doped into the second semiconductor material layer 26 may be reduced in the contact-resistance-reducing layer and may be increased in the second semiconductor material layer 26. Thus, during the formation process of the contact-resistance-reducing layer, a large amount of barrier-lowering ions may precipitate at the bottom boundary of the contact-resistance-reducing layer. That is, the barrier-lowering ions may precipitate at the interface between the contact-resistance-reducing layer and the second semiconductor material layer 26 and form a dipole layer at the interface between the contact-resistance-reducing layer and the second semiconductor material layer 26. The dipole layer may form an electric field. The direction of the electric field may be the same as the moving direction of the electrons. The electric field may reduce the width and the height of the barrier between the carriers in the second semiconductor material layer 26 and the metal. The carriers may thus transport to the metal layer directly. That is, the dipole layer may reduce the width and the height of the Schottky barrier height, i.e., $\phi Bn$, and may further reduce the parasitic resistance $\rho c$ of the source and the drain of the subsequently-formed N-type FinFET. The performance of the N-type FinFET may be improved.

It should be noted that, when the barrier-lowering ions doped into the second semiconductor material layer 26 include one or more types of sulfur ions, selenium ions, arsenic ions, and antimony ions, the concentration of the barrier-lowering ions may be higher than or equal to about $1E13$ atom/cm$^2$ and lower than or equal to about $1E15$ atom/cm$^2$. When the barrier-lowering ions doped into the second semiconductor material layer 26 include more than one types of the ions described above, the concentration of the barrier-lowering ions may be the total concentration of the more than one types of ions. If the concentration of the barrier-lowering ions is too high, an undesirably amount of lattice defects may be introduced into the second semiconductor material layer 26, and the performance of the subsequently-formed N-type FinFET may be adversely affected. If the concentration of the barrier-lowering ions is too low, the parasitic resistance of the source and the drain of the subsequently-formed N-type FinFET may not be sufficiently reduced.

If the barrier-lowering ions are germanium ions, it may not be easy for the second semiconductor material layer 26, doped with the germanium ions, to form metal silicide through the annealing process. Thus, the concentration of the germanium ions doped into the second semiconductor material layer 26 needs to be low. In one embodiment, the concentration of the doped germanium ions may be higher than or equal to about $1E13$ atom/cm$^2$ and lower than or equal to about $1E14$ atom/cm$^2$. If the concentration of the doped germanium ions is overly high, an undesirably amount of lattice defects may be introduced into the second semiconductor material layer 26, and the subsequent formation of the metal silicide may be more difficult. If the concentration of the doped germanium ions is overly low, the parasitic resistance of the source and the drain of the subsequently-formed N-type FinFET may not be sufficiently reduced.

If the barrier-lowering ions include a mixture of germanium ions and other barrier-lowering ions, the total concentration of the mixed barrier-lowering ions may be higher than or equal to about $1E13$ atom/cm$^2$ and lower than or equal to about $1E15$ atom/cm$^2$. Compared to the total concentration of other barrier-lowering ions, the concentration of the doped germanium ions should be lower.

The reasons for not doping any barrier-lowering ions in the first semiconductor material layer 25 may be described as follows. The barrier-lowering ions may only precipitate and form a dipole layer at the interface between the contact-resistance-reducing layer and the second semiconductor material layer 26 during the RTA process to form the metal silicide. Thus, if barrier-lowering ions are doped into the first semiconductor material layer 25, the barrier-lowering ions may not precipitate and may not form any dipole layer.

It should be noted that, in some other embodiments, the thickness of the contact-resistance-reducing layer may also be equal to the thickness of the second semiconductor material layer 26. During the formation of the contact-resistance-reducing layer, a large amount of barrier-reducing ions may precipitate at the bottom boundary of the contact-resistance-reducing layer. That is, a large amount of barrier-reducing ions may precipitate at the interface between the contact-resistance-reducing layer and the first semiconductor material layer 25, and form a dipole layer at the interface. The dipole layer may form an electric field. The direction of the electric field may be the same as the moving direction of the electrons. The electric field thus may reduce the width and the height of the barrier between the carriers in the first semiconductor material layer 25 and the metal. The carriers may thus transport to the metal directly. That is, the dipole layer may reduce the width and the height of the Schottky barrier height, and may further reduce the parasitic resistance $\rho c$ of the source and the drain of the subsequently-formed N-type FinFET. The performance of the N-type FinFET may be improved. The specific thickness of the contact-resistance-reducing layer should not be limited by the embodiments of the present disclosure.

As shown in FIG. 11, another aspect of the present disclosure further provides an N-type FinFET. As shown in FIG. 5, the N-type FinFET may include a substrate 20 with fin structures 21, a gate structure 22 positioned across the fin structures 21, ion implantation regions in the fin structures 21 at both sides of the gate structure 22. The top portions of the fin structures 21 may be removed. The N-type FinFET may also include a first semiconductor material layer 25 on the fin structures 21, with the top portions of the fin structures 21 removed. The first semiconductor material layer 25 may be doped with ions for forming the source and the drain. The N-type FinFET may also include a contact-resistance-reducing layer on the first semiconductor material layer 25. The substrate 20 may be made of a suitable semiconductor material.

In one embodiment, the height of the removed top portion of a fin structure 21 may be greater than or equal to the about 1/6 of the total height of the fin structure 21, and less than or equal to about 1/3 of the total height of the fin structure 21.

In one embodiment, the fin structures 21, with the top portion removed, may also include fin spacers. The height of a fin structure 21 may be greater than the height of the corresponding fin spacer.

In one embodiment, the ion implantation region may include at least one of an LDD ion implantation region and a Halo ion implantation region.

In one embodiment, a dipole layer may be formed at the bottom boundary of the contact-resistance-reducing layer.

In one embodiment, the dipole layer may be formed by one or more types of sulfur ions, selenium ions, arsenic ions, antimony ions, and germanium ions.

In one embodiment, the contact-resistance-reducing layer may be made of metal silicide.

In one embodiment, the first semiconductor material layer 25 may be made of silicon or silicon nitride.

The functions and arrangement of each layer may be referred to the embodiments described above and are not repeated herein.

Compared to a conventional transistor, the fabrication method provided in the current disclosure has several advantages.

For example, during the ion implantations on the fin structures, the ion implantations may cause damages to the crystal lattice in the fin structures. In the annealing process, because the fin structures are considerably small, it may be difficult to repair the damages on the crystal lattice. Thus, twin defects may be formed in the top portions of the fin structures. In the technical solution provided by the present disclosure, the top portion of a fin, with twin defects, may be removed to improve the performance of the subsequently-formed first semiconductor material layer on the fin structures. The performance of the N-type FinFET may be improved.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for forming a field-effect fin transistor (FinFET) structure, comprising:
    providing a substrate with fin structures;
    forming a gate structures across the fin structures;
    forming a first spacer material layer on top surfaces and sidewalls of the fin structures;
    forming ion implantation regions in the fin structures at both sides of the gate structure;
    forming a second spacer material layer on the first spacer material layer;
    performing a recess etching process on the first spacer material layer and the second spacer material layer to form the fin spacers;
    removing top portions of the fin spacers;
    removing top portions of the fin structures at both sides of the gate structure to form remaining portions of the fin structures, wherein a bottommost surface of the remaining portion of a fin structure is above a topmost surface of a corresponding fin spacer with the top portion of the fin spacer removed;
    forming a first semiconductor material layer on the remaining portions of the fin structures, the first semiconductor material layer being doped with ions for forming a source and a drain of the FinFET structure;
    forming a second semiconductor material layer on the first semiconductor material layer, the second semiconductor material being doped with barrier-lowering ions;
    forming a metal layer on the second semiconductor material layer, and
    performing an annealing process on the metal layer to form a contact-resistance-reducing layer.

2. The method according to claim 1, wherein the height of the removed top portion of the fin structure is greater than or equal to about 1/6 of a total height of the fin structure and is less than or equal to about 1/3 of the total height of the fin structure.

3. The method according to claim 1, wherein the ion implantation regions include at least one of a lightly-doped drain (LDD) ion implantation region and a Halo ion implantation region.

4. The method according to claim 1, wherein the barrier-lowering ions include one or more types of sulfur ions, selenium ions, arsenic ions, antimony ions, and germanium ions.

5. The method according to claim 1, wherein the first semiconductor material layer is made of silicon, silicon carbide, or a combination of silicon and silicon carbide; and the second semiconductor material layer is made of silicon.

6. The method according to claim 5, wherein the contact-resistance-reducing layer is made of metal silicide.

7. The method according to claim 1, wherein the metal layer is made of one or more of cobalt, molybdenum, platinum, tantalum, titanium, and tungsten.

8. The method according to claim 1, wherein one or more of in-situ doping growth and epitaxial deposition are used to form the first semiconductor material layer and the second semiconductor material layer.

9. A method for forming a field-effect fin transistor (FinFET) structure, comprising:
    providing a substrate with fin structures;
    forming a gate structures across the fin structures;
    forming ion implantation regions in the fin structures at both sides of the gate structure;
    removing top portions of the fin structures at both sides of the gate structure to form remaining portions of the fin structures;
    forming a first semiconductor material layer on the remaining portions of the fin structures, the first semiconductor material layer being doped with ions for forming a source and a drain of the FinFET structure;
    forming a second semiconductor material layer on the first semiconductor material layer, the second semiconductor material being doped with barrier-lowering ions, doping phosphorus ions into the second semiconductor material layer when forming the second semiconductor material layer, a concentration of the phosphorus ions being higher than a concentration of the barrier-lowering ions;
    forming a metal layer on the second semiconductor material layer, and
    performing an annealing process on the metal layer to form a contact-resistance-reducing layer.

10. The method according to claim 9, wherein a height of a removed top portion of a fin structure is greater than or equal to about 1/6 of a total height of the fin structure and is less than or equal to about 1/3 of the total height of the fin structure.

11. The method according to claim 9, wherein the ion implantation regions include at least one of a lightly-doped drain (LDD) ion implantation region and a Halo ion implantation region.

12. The method according to claim 9, wherein the barrier-lowering ions include one or more types of sulfur ions, selenium ions, arsenic ions, antimony ions, and germanium ions.

13. An N-type field effect fin transistor (FinFET) structure, comprising:
    a substrate with fin structures;
    a gate structure positioned across the fin structures;
    fin spacers surrounding the fin structures;

ion implantation regions in the fin structures on both sides of the gate structure;

a source and a drain formed on the fin structures; and a contact-resistance-reducing layer formed on the source and the drain of the FinFET structure, wherein:

top portions of the fin spacers are removed;

top portions of the fin structures on both sides of the gate structure are removed to form remaining portions of the fin structures;

a bottommost surface of the remaining portion of the fin structure is above a topmost surface of a corresponding fin spacer with the top portion of the fin spacer removed;

a first semiconductor material layer is formed on the remaining portions of the fin structures, the first semiconductor material layer being doped with ions for forming a source and a drain of the FinFET; and the contact-resistance-reducing layer is formed on the first semiconductor material layer.

14. The FinFET structure according to claim 13, wherein the height of the removed top portion of the fin structure is greater than or equal to about ⅙ of a total height of the fin structure and is less than or equal to about ⅓ of the total height of the fin structure.

15. The FinFET structure according to claim 13, wherein the contact-resistance-reducing layer includes a dipole layer at a bottom boundary of the contact-resistance-reducing layer.

16. The FinFET structure according to claim 15, wherein the dipole layer is formed by one or more types of sulfur ions, selenium ions, arsenic ions, antimony ions, and germanium ions.

17. The FinFET structure according to claim 13, wherein the ion implantation regions includes at least one of a lightly-doped drain (LDD) ion implantation region and a Halo ion implantation region.

18. The FinFET structure according to claim 13, wherein the contact-resistance-reducing layer is made of metal silicide.

19. The FinFET structure according to claim 18, wherein the metal silicide is formed by silicon and one or more of cobalt, molybdenum, platinum, tantalum, titanium, and tungsten.

20. The FinFET structure according to claim 13, wherein the first semiconductor material layer is made of silicon, silicon carbide, or a combination or silicon and silicon carbide.

* * * * *